United States Patent
Mok et al.

(10) Patent No.: US 10,083,646 B2
(45) Date of Patent: Sep. 25, 2018

(54) DISPLAY APPARATUS HAVING ENHANCED CENTER WAVELENGTH, METHOD OF CONTROLLING THE DISPLAY APPARATUS, AND COMPUTER PROGRAM FOR EXECUTING THE METHOD

(71) Applicant: SAMSUNG DISPLAY CO., LTD., Yongin-si, Gyeonggi-Do (KR)

(72) Inventors: Rangkyun Mok, Yongin-si (KR); Yijoon Ahn, Yongin-si (KR); Hyeyong Chu, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 181 days.

(21) Appl. No.: 15/087,137

(22) Filed: Mar. 31, 2016

(65) Prior Publication Data
US 2017/0076650 A1    Mar. 16, 2017

(30) Foreign Application Priority Data
Sep. 15, 2015  (KR) ........................ 10-2015-0130613

(51) Int. Cl.
| G09G 3/30 | (2006.01) |
| G09G 3/20 | (2006.01) |
| G09G 3/3225 | (2016.01) |
| G09G 3/3208 | (2016.01) |
| H01L 51/52 | (2006.01) |

(52) U.S. Cl.
CPC ......... *G09G 3/2003* (2013.01); *G09G 3/3208* (2013.01); *G09G 3/3225* (2013.01); *G09G 2300/0452* (2013.01); *G09G 2320/0276* (2013.01); *G09G 2320/0666* (2013.01);
(Continued)

(58) Field of Classification Search
CPC ... G09G 2300/0452; G09G 2320/0276; G09G 2340/06; G09G 2320/0666; G09G 3/2003; G09G 3/3208; G09G 3/20; G09G 3/3225

See application file for complete search history.

(56) References Cited

U.S. PATENT DOCUMENTS

| 7,623,216 | B2 * | 11/2009 | Hwang | ................. G09G 3/006 349/192 |
| 8,063,552 | B2 * | 11/2011 | Cok | ....................... H05B 33/22 313/503 |

(Continued)

FOREIGN PATENT DOCUMENTS

| KR | 1020060135276 | 12/2006 |
| KR | 10-2008-0062549 | 7/2008 |

(Continued)

OTHER PUBLICATIONS

Gerald H. Jacobs, et al., "Photopigments of Dogs and Foxes and Their Implications for Canid Vision," Visual Neuroscience (1993), 11, pp. 173-180.

(Continued)

*Primary Examiner* — Vijay Shankar
(74) *Attorney, Agent, or Firm* — F. Chau & Associates, LLC

(57) ABSTRACT

An display apparatus includes a plurality of pixels. Each of the plurality of pixels includes a first sub-pixel that emits light of a first color having a center wavelength from 390 nm to 450 nm and a second sub-pixel that emits light of a second color different from the first color.

28 Claims, 10 Drawing Sheets

(52) U.S. Cl.
CPC ...... *G09G 2340/06* (2013.01); *H01L 51/5265* (2013.01); *H01L 2251/558* (2013.01)

(56) References Cited

U.S. PATENT DOCUMENTS

| | | | | |
|---|---|---|---|---|
| 8,094,933 | B2* | 1/2012 | Cok | G09G 3/2003 345/694 |
| 8,289,349 | B2* | 10/2012 | Kobayashi | G09G 3/22 345/690 |
| 8,466,856 | B2* | 6/2013 | Hamer | G09G 3/2003 315/169.3 |
| 8,598,775 | B2* | 12/2013 | Kim | F21K 9/00 313/498 |
| 9,275,575 | B2* | 3/2016 | Adachi | G09G 3/3208 |
| 2007/0109245 | A1* | 5/2007 | Hwang | G09G 3/006 345/98 |
| 2009/0102352 | A1 | 4/2009 | Cok et al. | |
| 2009/0154805 | A1 | 6/2009 | Cok et al. | |
| 2010/0045154 | A1 | 2/2010 | Kim et al. | |
| 2011/0025681 | A1 | 2/2011 | Komatsu et al. | |
| 2011/0025887 | A1* | 2/2011 | Kobayashi | G09G 3/22 348/241 |
| 2011/0121320 | A1 | 5/2011 | Pieh et al. | |
| 2011/0234644 | A1* | 9/2011 | Park | G09G 3/2003 345/690 |
| 2012/0212515 | A1 | 8/2012 | Hamer et al. | |
| 2015/0034923 | A1 | 2/2015 | Kim et al. | |
| 2015/0123885 | A1 | 5/2015 | Adachi | |

FOREIGN PATENT DOCUMENTS

| | | |
|---|---|---|
| KR | 10-2011-0057377 | 6/2011 |
| KR | 1020120075271 | 7/2012 |
| KR | 10-2015-0015647 | 2/2015 |
| KR | 1020150030564 | 3/2015 |

OTHER PUBLICATIONS dogtime.com: "Do dogs actually watch and react to television?", dogtime.com, Jan. 20, 2015, XP009191415.
Extended European Search Report dated Aug. 30, 2016.

* cited by examiner

DISPLAY APPARATUS HAVING ENHANCED CENTER WAVELENGTH, METHOD OF CONTROLLING THE DISPLAY APPARATUS, AND COMPUTER PROGRAM FOR EXECUTING THE METHOD

CROSS-REFERENCE TO RELATED APPLICATION

This application claims priority to Korean Patent Application No. 10-2015-0130613, filed on Sep. 15, 2015, in the Korean Intellectual Property Office, the disclosure of which is incorporated by reference herein in its entirety.

TECHNICAL FIELD

One or more exemplary embodiments of the present invention relate to a display apparatus, a method of controlling the display apparatus, and a computer program for executing the method.

DISCUSSION OF THE RELATED ART

Display apparatuses, such as organic light-emitting display apparatuses are known for having excellent viewing characteristics such as viewing angle, contrast, response time, and low power consumption and are accordingly being used in personal portable devices, such as MP3 players and mobile phones, and are also used in televisions (TVs) and other stationary devices with displays. Organic light-emitting display apparatuses are self-luminescent and do not require a separate light source, unlike a liquid crystal display (LCD) apparatus, and thus, an organic light-emitting display apparatus may be relatively small and light.

Traditionally, display apparatuses have been optimized for viewing exclusively by human subjects. However, a growing amount of video content is being distributed for viewing by pets and other animals. Different animals may have different visual capabilities and an image displayed on an organic light-emitting display apparatus that is optimized to visual capabilities of a human might not be efficiently recognized by a pet.

In addition, an organic light-emitting display apparatus includes a micro-cavity structure that employs a mechanism where, as light beams repeatedly travel back and forth between a reflective layer and a semi-transparent layer, which are separated by a certain distance (referred to hereinafter as an 'optical path length'), and strong interference occurs between the light beams, light of a particular wavelength is amplified and light of the other wavelengths is offset. By using the micro-cavity structure, light having a desired wavelength may be amplified by adjusting an optical path length.

SUMMARY

One or more exemplary embodiments of the present invention include a display apparatus capable of displaying images that may be efficiently recognized by a pet, a method of controlling the display apparatus, and a computer program for executing the method.

Additional aspects of various exemplary embodiments of the present invention will be set forth in part in the description which follows and, in part, will be apparent from the description, or may be learned by practice of the presented embodiments.

According to one or more exemplary embodiments of the present invention, a display apparatus includes a plurality of pixels. Each of the plurality of pixels includes a first sub-pixel that emits light of a first color having a center wavelength from 390 nm to 450 nm and a second sub-pixel that emits light of a second color different from the first color.

According to an exemplary embodiment of the present invention, the first sub-pixel may include a pixel electrode, which is arranged on a substrate including a thin-film transistor, is electrically connected to the thin-film transistor, and reflects at least some of incident light. An organic layer is arranged on the pixel electrode and includes a light-emitting layer. A counter electrode is arranged on the organic layer and constitutes a resonance structure together with the pixel electrode by reflecting at least some of light emitted by the light-emitting layer.

According to an exemplary embodiment of the present invention, light emitted by the light-emitting layer may exit the display apparatus via the counter electrode. The pixel electrode may include a reflective electrode. The counter electrode may include a semi-transparent layer that forms resonance together with the reflective electrode.

According to an exemplary embodiment of the present invention, when a distance between the reflective electrode and the semi-transparent layer is referred to as an optical path length, the first sub-pixel may be formed to have an optical path length corresponding to the center wavelength of 420 nm.

According to an exemplary embodiment of the present invention, the optical path length of the first sub-pixel may be from 147 nm to 179 nm.

According to an exemplary embodiment of the present invention, a center wavelength of the second color may be in a range from 520 nm to 590 nm.

According to an exemplary embodiment of the present invention, the second sub-pixel may include a pixel electrode, which is arranged on a substrate including a thin-film transistor. The pixel electrode may be electrically connected to the thin-film transistor, and may reflect at least some of an incident light. An organic layer is arranged on the pixel electrode and includes a light-emitting layer. A counter electrode is arranged on the organic layer and constitutes a resonance structure together with the pixel electrode by reflecting at least some of light emitted by the light-emitting layer.

According to an exemplary embodiment of the present invention, light emitted by the light-emitting layer may exit the display apparatus via the counter electrode. The pixel electrode may include a reflective electrode. The counter electrode may include a semi-transparent layer that forms resonance together with the reflective electrode.

According to an exemplary embodiment of the present invention, when a distance between the reflective electrode and the semi-transparent layer is referred to as an optical path length, the second sub-pixel may be formed to have an optical path length corresponding to the center wavelength of 555 nm.

According to an exemplary embodiment of the present invention, the optical path length of the second sub-pixel may be from 236 nm to 288 nm.

According to an exemplary embodiment of the present invention, the semi-transparent layer may include a semi-transparent metal layer that includes at least one metal selected from a group consisting of Ag, Al, Mg, Li, Ca, Cu, LiF/Ca, LiF/Al, MgAg, and CaAg.

According to an exemplary embodiment of the present invention, the pixel electrode may further include a transparent layer formed on the reflective electrode. The transparent layer may include at least one selected from a group consisting of indium tin oxide (ITO), indium zinc oxide (IZO), zinc oxide (ZnO), indium oxide ($In_2O_3$), indium gallium oxide (IGO), and aluminum zinc oxide (AZO).

According to an exemplary embodiment of the present invention, a size of the first sub-pixel may be larger than that of the second sub-pixel.

According to an exemplary embodiment of the present invention, each of the plurality of pixels may further include a third sub-pixel that emits white light.

According to an exemplary embodiment of the present invention, a center wavelength of the first color may be in a range from 405 nm to 435 nm.

According to an exemplary embodiment of the present invention, a center wavelength of the first color may be in a range from 415 nm to 425 nm.

According to an exemplary embodiment of the present invention, the display apparatus further includes a display controller, which provides image data to be displayed on the display apparatus. The display controller may include an RGB data receiver, which receives RGB data including sub-pixel data regarding red, green, and blue sub-pixels. A data modulator modulates the RGB data to YB data including data regarding the first sub-pixel and data regarding the second sub-pixel. A data corrector performs a gamma correction to the YB data. A data outputter outputs the gamma-corrected YB data.

According to an exemplary embodiment of the present invention, the data modulator may modulate the RGB data to YBW data. The RGB data may include data regarding the first sub-pixel, data regarding the second sub-pixel, and data regarding a third sub-pixel that emits white light. The data corrector may perform a gamma correction to the YBW data. The data outputter may output the gamma-corrected YBW data.

According to an exemplary embodiment of the present invention, a gamma value for determining characteristics of a gamma curve used for the gamma correction may be greater than 2.

According to an exemplary embodiment of the present invention, the display apparatus may include a substrate. A light-emitting unit is formed on the substrate and includes a plurality of pixels. A sealing unit is formed on the substrate and seals the light-emitting unit.

According to an exemplary embodiment of the present invention, the sealing unit may include a thin-film encapsulating layer. The substrate and the sealing unit may be flexible.

According to one or more exemplary embodiments of the present invention, a method of controlling display of a display apparatus by using a processor is provided. The method includes receiving RGB data including sub-pixel data regarding red, green, and blue sub-pixels. The RGB data is modulated to YB data including data regarding a first sub-pixel that emits light of a first color having a center wavelength in a range from 390 nm to 450 nm and data regarding a second sub-pixel that emits light of a second color different from the first color. A gamma correction is performed on the YB data. The gamma-corrected YB data is outputted.

According to one or more exemplary embodiments of the present invention, there is provided a non-transitory computer readable recording medium having recorded thereon a computer program for implementing the method of controlling a display apparatus.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
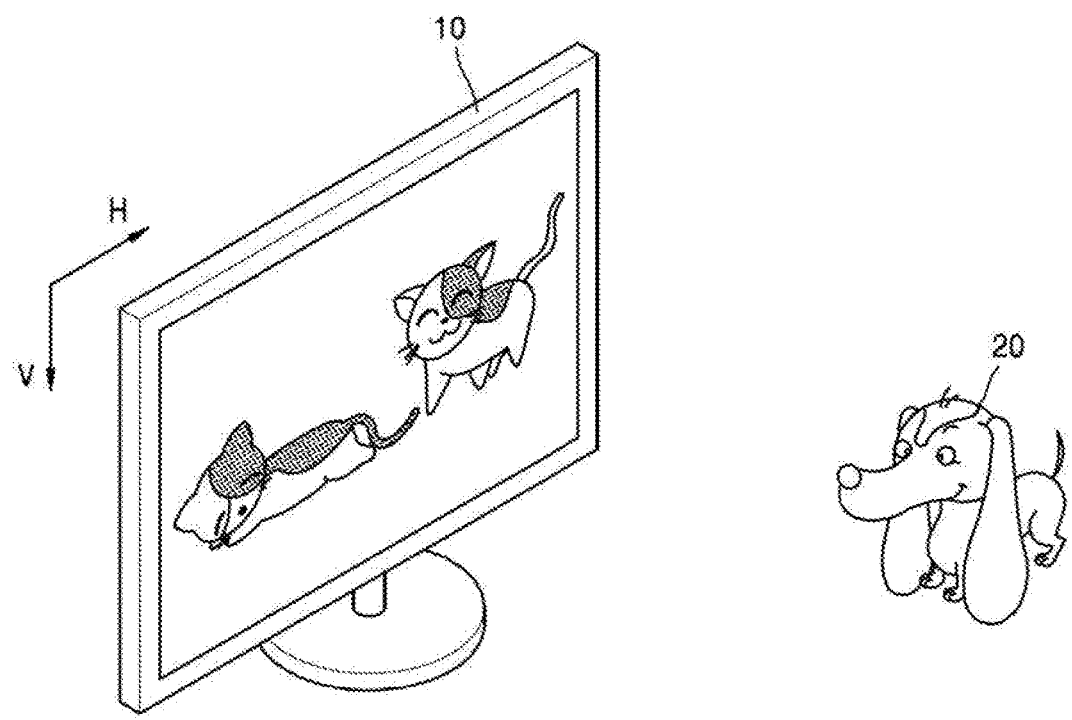
FIG. 1 is a diagram illustrating a display apparatus according to an exemplary embodiment of the present invention.

Reference will now be made in detail to exemplary embodiments of the present invention, which are illustrated in the accompanying drawings. Like reference numerals may refer to like elements throughout the figures and detailed description. In this regard, the presented exemplary embodiments may have different forms and should not be construed as being limited to the descriptions set forth herein. Accordingly, the exemplary embodiments are merely described below, by referring to the figures, to explain aspects thereof.

Exemplary embodiments of the present disclosure will be described below in more detail with reference to the accompanying drawings. It may be assumed that where descriptions of elements are omitted, those elements may be similar to or identical to elements having the same reference numerals described elsewhere within the detailed description.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation.

FIG. 1 is a diagram illustrating a display apparatus 10 according to an exemplary embodiment of the present invention.

Referring to FIG. 1, the display apparatus 10 according to an exemplary embodiment may have a rectangular display screen having sides parallel to a horizontal direction H and sides parallel to a vertical direction V. However, the present disclosure is not limited thereto, and a display screen may have any arbitrary shape such as a circular shape, a polygonal shape, or a polygon with rounded sides. Furthermore, the display apparatus 10 may be provided as a flexible display apparatus.

The display apparatus 10 according to an exemplary embodiment of the present invention may be provided to emit light suitable to visual capabilities of a pet 20. Visual capabilities of a pet are different from that of a human, and thus an image displayed by a display apparatus designed by taking into account human visual capabilities might not be efficiently recognized by a pet. Therefore, exemplary embodiments of the present invention provide a display apparatus 10 designed to emit light optimized to visual capabilities of the pet 20, and thus an image displayed by the display apparatus 10 according to exemplary embodiments of the present invention may be efficiently recognized by the pet 20. In detail, exemplary embodiments of the present invention provide the display apparatus 10 designed to emit light optimized to visual capabilities of a dog, and thus an image displayed by the display apparatus 10 according to an exemplary embodiment of the present invention may be efficiently recognized by a dog.

The display apparatus 10 includes a display panel for displaying an image and may further include components such as a supporter, stand or mounting hardware that supports the display panel, a controller that controls the display panel, and a communicator for transmitting or receiving data for displaying an image.

Figure 2:
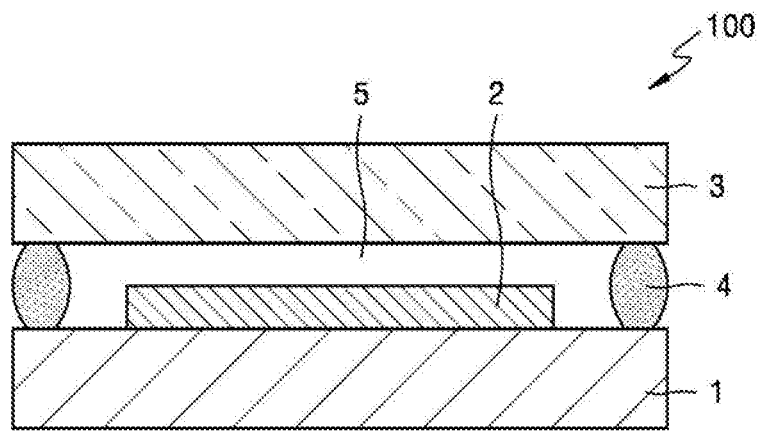
FIG. 2 is a sectional view showing an example of a display panel according to an exemplary embodiment of the present invention.

FIG. 2 is a sectional view showing an example of a display panel 100 according to an exemplary embodiment of the present invention.

The display apparatus 10 of FIG. 1 may include the display panel 100 shown in FIG. 2. Referring to FIG. 2, the display panel 100 according to an exemplary embodiment of the present invention includes a light-emitting unit 2 on a surface of a lower substrate 1 and a sealing substrate 3 that seals the light-emitting unit 2 upon the lower substrate 1. The lower substrate 1 and the sealing substrate 3 may include transparent glass, a metal, or plastic and may include a flexible material.

If the display panel 100 is a bottom emission type in which light emitted by the organic light-emitting unit 2 passes through the lower substrate 1 and is emitted via a rear surface of the display panel 100, the lower substrate 1 may include transparent glass or transparent plastic, and thus an image may be displayed via the lower substrate 1. If the display panel 100 is a top emission type in which light emitted by the light-emitting unit 2 passes through the sealing substrate 3 and is emitted via a front surface of the organic light-emitting display panel 100, the sealing substrate 3 may include transparent glass or transparent plastic, and thus an image may be displayed via the sealing substrate 3.

Alternatively, both the lower substrate 1 and the sealing substrate 3 may include transparent glass or transparent plastic, and thus a transparent display panel may be embodied.

Edges of the lower substrate 1 are combined with edges of the sealing substrate 3 via a sealing material 4, and thus, a space 5 between the lower substrate 1 and the sealing substrate 3 is sealed. A moisture absorbent or a filler may be arranged in the space 5 or the space may remain empty.

Figure 3:
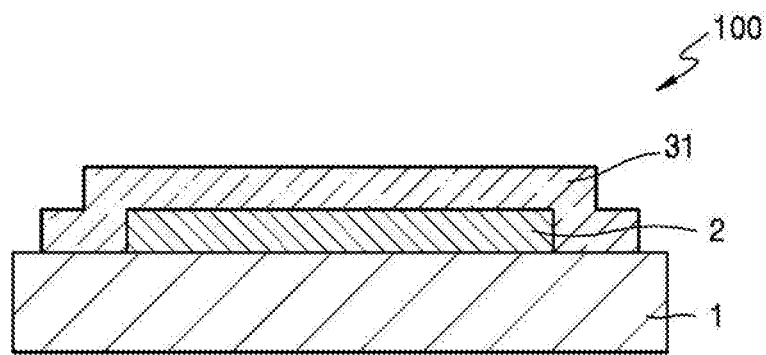
FIG. 3 is a sectional view showing a display panel according to an exemplary embodiment of the present invention.

FIG. 3 is a sectional view showing a display panel according to an exemplary embodiment of the present invention.

Referring to FIG. 3, a thin-film encapsulating layer 31 may be formed on the light-emitting unit 2, instead of the sealing substrate 3, thereby protecting the light-emitting unit 2 from the outside atmosphere. In the case of employing the thin-film encapsulating layer 31, as shown in FIG. 3, the display panel 100 may become more flexible.

The thin-film encapsulating layer 31 may include a plurality of inorganic layers or a combination of organic layers and inorganic layers.

An organic layer of the thin-film encapsulating layer 31 may include a polymer and may be a single layer or stacked layers formed of any one or more of polyethylene terephthalate, polyimide, polycarbonate, epoxy, polyethylene, and polyacrylate. As an example, an organic layer may include polyacrylate, and for example, may include a polymerized monomer composition including a diacrylate-based monomer and a triacrylate-based monomer. The monomer composition may further include a monoacrylate-based monomer. Furthermore, the monomer composition may further include a photoinitiator known in the art, e.g., TPO. However, the present disclosure is not limited thereto.

An inorganic layer of the thin-film encapsulating layer 31 may be a single layer or may be comprised of stacked layers including a metal oxide or a metal nitride. Particularly, the inorganic layer may include any one or more of $SiN_x$, $Al_2O_3$, $SiO_2$, and $TiO_2$.

The topmost layer from among layers constituting the thin-film encapsulating layer 31, which is exposed to the outside, may include an inorganic layer for preventing moisture permeation to the light-emitting unit 2.

The thin-film encapsulating layer 31 may include at least one sandwich structure including at least two inorganic layers and at least one organic layer interposed therebetween. In an example, the thin-film encapsulating layer 31 may include at least one sandwich structure including at least two organic layers and at least one inorganic layer interposed therebetween. In an example, the thin-film encapsulating layer 31 may include a sandwich structure including at least two inorganic layers and at least one organic layer interposed therebetween and a sandwich structure including at least two organic layers and at least one inorganic layer interposed therebetween.

The thin-film encapsulating layer 31 may include a first inorganic layer, a first organic layer, and a second inorganic layer in the order stated, and in a direction from the top of the light-emitting unit 2, upwardly therefrom. In an example, the thin-film encapsulating layer 31 may include a first inorganic layer, a first organic layer, a second inorganic layer, a second organic layer, and a third inorganic layer in the order stated, and in a direction from the top of the light-emitting unit 2, upwardly therefrom. In an example, the thin-film encapsulating layer 31 may include a first inorganic layer, a first organic layer, a second inorganic layer, a second organic layer, a third inorganic layer, a third organic layer, and a fourth inorganic layer in the order stated, and in a direction from the top of the light-emitting unit 2, upwardly therefrom.

A metal halide layer including lithium fluoride (LiF) may be additionally arranged between the light-emitting unit 2 and the first inorganic layer. The metal halide layer prevents damage to the light-emitting unit 2 when the first inorganic layer is formed via sputtering or plasma deposition.

The first organic layer may be formed to be smaller than the second inorganic layer, and the second organic layer may be formed to be smaller than the third inorganic layer.

The first organic layer may be formed to be completely covered by the second inorganic layer, and the second organic layer may be formed to be completely covered by the third inorganic layer.

The embodiments shown in FIGS. 2 and 3 may provide a bottom emission type in which an image is embodied toward the lower substrate 1, a top emission type in which an image is embodied toward the sealing substrate 3 or the thin-film encapsulating layer 31, or a dual emission type in which images are embodied toward the lower substrate 1 and the sealing substrate 3 or the lower substrate 1 and the thin-film encapsulating layer 31.

Figure 4:
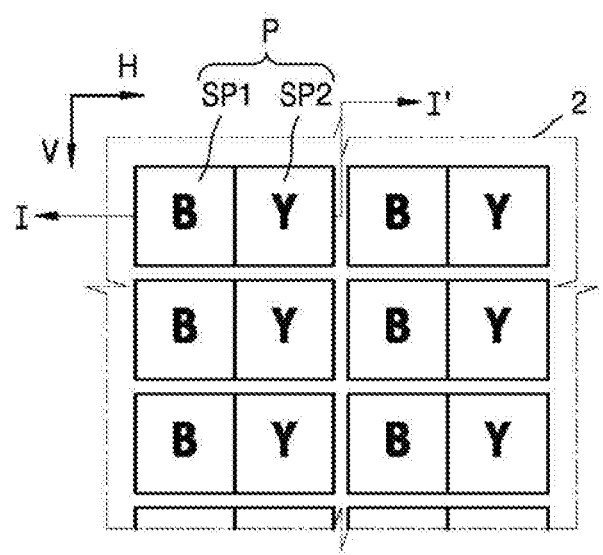
FIG. 4 is a plan view illustrating a portion of a light-emitting unit according to an exemplary embodiment of the present invention.

FIG. 4 is a plan view of a portion of the light-emitting unit 2 according to an exemplary embodiment of the present invention.

Referring to FIG. 4, the light-emitting unit 2 includes a plurality of pixels P. Although FIG. 4 shows that the plurality of pixels P are arranged in the column-wise direction V and the row-wise direction H, the present disclosure is not limited thereto. For example, the plurality of pixels P may be arranged in an angled direction, e.g., a diagonal direction.

Each of the pixels P includes a first sub-pixel SP1 emitting light of a first color and a second sub-pixel SP2 emitting light of a second color. The first color is different from the second color. The pixels P need not include sub-pixels of a third human-visible color. The first color and the second color are two different colors capable of mixing to white light. According to an embodiment, the first color is blue, whereas the second color is yellow.

Although FIG. 4 shows that the second sub-pixel SP2 is disposed at the right of the first sub-pixel SP1 in every pixel P, the present disclosure is not limited thereto. For example, the light-emitting unit 2 may include a pixel P in which the second sub-pixel SP2 is disposed at the left of the first sub-pixel SP1. Furthermore, the light-emitting unit 2 may include both the pixel P in which the second sub-pixel SP2 is disposed at the right of the first sub-pixel SP1 and the pixel P in which the second sub-pixel SP2 is disposed at the left of the first sub-pixel SP1. In this case, the pixel P in which the second sub-pixel SP2 is disposed at the right of the first sub-pixel SP1 may be arranged adjacent to the pixel P in which the second sub-pixel SP2 is disposed at the left of the first sub-pixel SP1.

Although FIG. 4 shows that all sub-pixels have a same size and shape, it is merely an example, and the present disclosure is not limited thereto. For example, the first sub-pixel SP1 exhibiting relatively low light emitting efficiency may be formed to be larger than the second sub-pixel SP2.

Meanwhile, although not shown in FIG. 4, each pixel P of the light-emitting unit 2 may further include a sub-pixel emitting light having a wavelength range corresponding to the ultraviolet, for example, a wavelength from 265 nm to 390 nm. A human is unable to see ultraviolet light. However, a dog has visual capabilities for seeing ultraviolet light. Therefore, by further arranging a sub-pixel emitting light of the ultraviolet ray, a display apparatus for displaying an image by using light customized to visual capabilities of a dog may be embodied.

Figure 5:
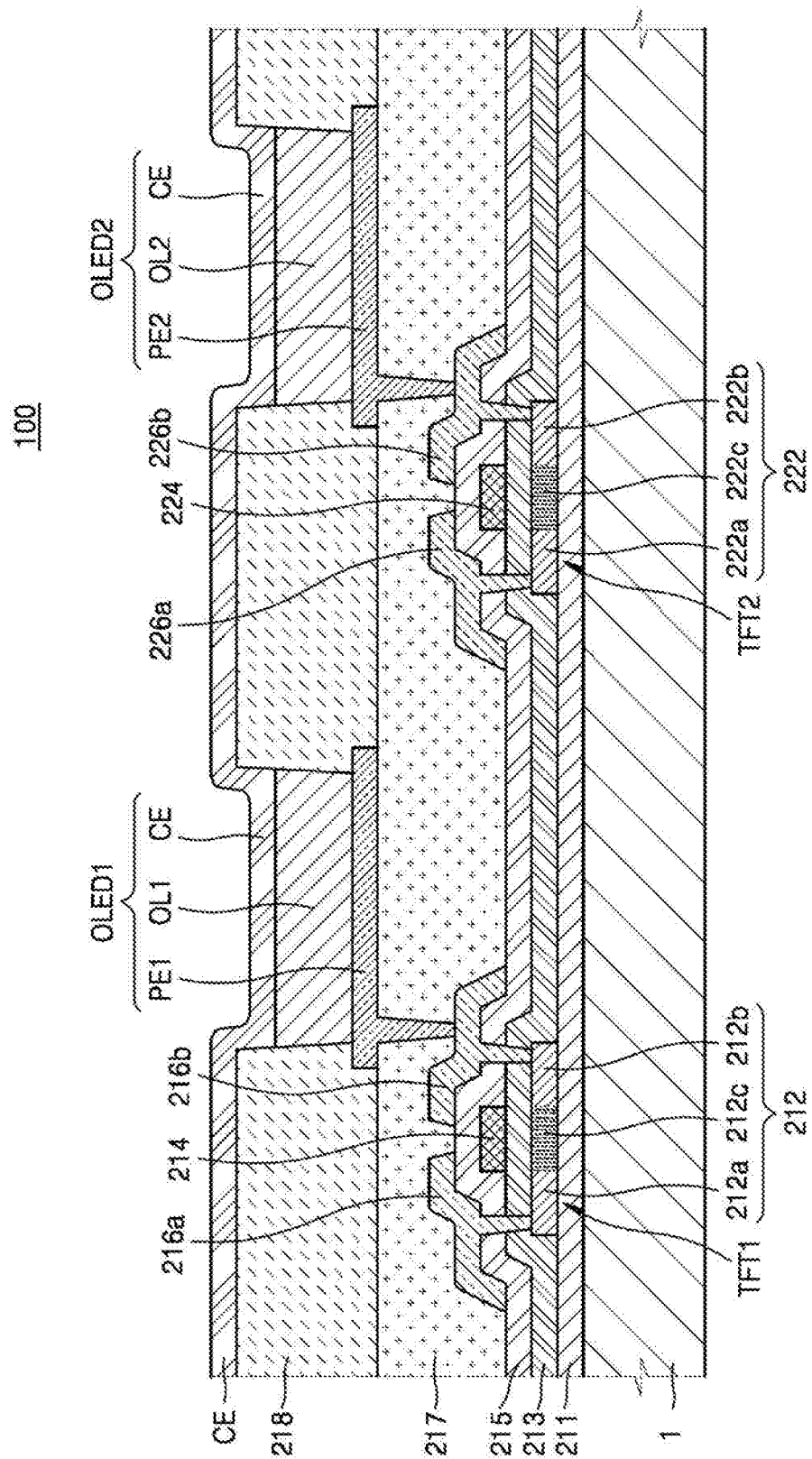
FIG. 5 is a sectional view illustrating the portion of the light-emitting unit of FIG. 4, obtained along a line I-I' of FIG. 4.

FIG. 5 is a sectional view of the portion of the light-emitting unit 2 of FIG. 4, obtained along a line I-I' of FIG. 4.

Referring to FIGS. 4 and 5, the display panel 100 according to an exemplary embodiment of the present invention includes a lower substrate 1. Thin-film transistors, for example, first and second thin-film transistors TFT1 and TFT2 are disposed on the lower substrate 1. Pixel electrodes, for example, first and second pixel electrodes PE1 and PE2 are electrically connected to the first and second thin-film transistors TFT1 and TFT2 and reflect at least some incident light. Organic layers, for example, first and second organic layers OL1 and OL2, and a counter electrode CE are disposed on the pixel electrodes PE1 and PE2 and together form organic light emitting diodes, for example, OLED1 and OLED2. Although not shown in FIG. 5, a sealing substrate or a thin-film encapsulating layer may be further arranged on the counter electrode CE.

The lower substrate 1 may include $SiO_2$-based glass, a metal, or plastic. Particularly, in the case of embodying the display apparatus 10 according to an exemplary embodiment of the present invention as a flexible display apparatus. For example, the lower substrate 1 may include plastic with excellent heat-resistance and excellent durability, such as polyethylene terephthalate (PET), polyimide, polycarbonate, polyethylene naphthalate, polyarylate (PAR), and polyether imide.

A buffer layer 211, that prevents permeation of impurity ions and planarizes the lower substrate 1, is arranged on the lower substrate 1. The first thin-film transistor TFT1 and the second thin-film transistor TFT2 are arranged on the buffer layer 211. The first thin-film transistor TFT1 is arranged at the first sub-pixel SP1, the second thin-film transistor TFT2 is arranged at the second sub-pixel SP2.

The first thin-film transistor TFT1 may include an active layer 212, a gate electrode 214, a source electrode 216a, and a drain electrode 216b. The second thin-film transistor TFT2 may include an active layer 222, a gate electrode 224, a source electrode 226a, and a drain electrode 226b.

The active layers 212 and 222 may each include a semiconductor material, such as amorphous silicon or polysilicon. However, the present disclosure is not limited thereto, and the active layers 212 and 222 may each include an oxide semiconductor. The active layers 212 and 222 may each include channel regions 212c and 222c, source regions 212a and 222a, and drain regions 212b and 222b, which are doped with impurity ions, outside the channel regions 212c and 222c, respectively.

The gate electrodes 214 and 224 are respectively arranged on the active layers 212 and 222, and a gate insulation layer 213 is arranged between the active layers 212 and 222 and the gate electrodes 214 and 224. The gate electrodes 214 and 224 may include one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) and may include single layers or multiple layers.

An interlayer insulation layer 215 is arranged on the gate electrodes 214 and 224. The source electrodes 216a and 226a and the drain electrodes 216b and 226b, which are respectively connected to the source regions 212a and 222a and the drain regions 212b and 222b of the active layers 212 and 222, are arranged on the gate electrodes 214 and 224 via the interlayer insulation layer 215.

The source electrodes 216a and 226a and the drain electrodes 216b and 226b may include one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) and may include single layers or multiple layers.

A planarizing layer 217 is arranged on the source electrodes 216a and 226a and the drain electrodes 216b and 226b, where the planarizing layer 217 electrically interconnects any one of the source electrodes 216a and 226a and the drain electrodes 216b and 226b to the first and second pixel electrodes PE1 and PE2, respectively.

The first organic light-emitting diode device OLED1 and a second organic light-emitting diode device OLED2 are arranged on the planarizing layer 217. The first organic light-emitting diode device OLED1 is arranged at the first sub-pixel SP1, the second organic light-emitting diode device OLED2 is arranged at the second sub-pixel SP2.

The first organic light-emitting diode device OLED1 includes the first pixel electrode PE1 electrically connected to the first thin-film transistor TFT1, the first organic layer OL1 arranged on the first pixel electrode PE1, and the counter electrode CE arranged on the first organic layer OL1.

The second organic light-emitting diode device OLED2 includes the second pixel electrode PE2 electrically connected to the second thin-film transistor TFT2, the second organic layer OL2 arranged on the second pixel electrode PE2, and the counter electrode CE arranged on the second organic layer OL2.

The first and second organic layers OL1 and OL2 are arranged at regions between the first and second pixel electrodes PE1 and PE2 and the counter electrode CE defined by a pixel defining layer 218. The first and second organic layers OL1 and OL2 may be formed by using various methods, such as vapor deposition, thermal transfer, or printing, where thicknesses of the first and second organic layers OL1 and OL2 may be determined to satisfy resonance conditions based on wavelengths of emitting light.

According to an exemplary embodiment of the present invention, the first and second pixel electrodes PE1 and PE2 may be anodes, and the counter electrode CE may be a cathode. When a voltage is applied to the first pixel electrode PE1 and the counter electrode CE, holes and electrons are injected to a light-emitting layer included in the first organic layer OL1 from the first pixel electrode PE1 and the counter electrode CE, respectively. As excitons, which are combinations of the injected holes and electrons, transition from an excited state to a ground state, the first sub-pixel SP1 emits light. When a voltage is applied to the second pixel electrode PE2 and the counter electrode CE, holes and electrons are injected to a light-emitting layer included in the second organic layer OL2 from the second pixel electrode PE2 and the counter electrode CE, respectively. As excitons, which are combinations of the injected holes and electrons, transition from an excited state to a ground state, the second sub-pixel SP2 emits light.

Although a structure in which the first and second organic light-emitting diode devices OLED1 and OLED2 are respectively arranged on the first and second thin-film transistors TFT1 and TFT2 is described above, the present disclosure is not limited thereto. For example, various modifications may be made thereto, e.g., a structure in which the first and second pixel electrodes PE1 and PE2 of the first and second organic light-emitting diode devices OLED1 and OLED2 are formed on a same layer as the active layers 212 and 222 of the first and second thin-film transistors TFT1 and TFT2, a structure in which the first and second pixel electrodes PE1 and PE2 are formed on a same layer as the gate electrodes 214 and 224 of the first and second thin-film transistors TFT1 and TFT2, or a structure in which the first and second pixel electrodes PE1 and PE2 are formed on a same layer as the source electrodes 216a and 226a and the drain electrodes 216b and 226b of the first and second thin-film transistors TFT1 and TFT2.

Furthermore, although an arrangement of a top gate structure in which gate electrodes 214 and 224 of the first and second thin-film transistors TFT1 and TFT2 are arranged on the active layers 212 and 222 is described, the present disclosure is not limited thereto. For example, a bottom gate structure in which the gate electrodes 214 and 224 are arranged below the active layers 212 and 222 may be employed.

Although not shown in FIG. 5, an encapsulating member for preventing outside moisture and/or oxygen from permeating into the first and second organic light-emitting diode devices OLED1 and OLED2 may be arranged on the counter electrode CE.

The encapsulating member may be the sealing substrate 3 shown in FIG. 2, the thin-film encapsulating layer 31 shown in FIG. 3, an encapsulating substrate including glass, or a metal sheet. However, in the case of embodying the display apparatus 10 as a flexible display apparatus, the encapsulating member may include the thin-film encapsulating layer 31.

Figure 6:
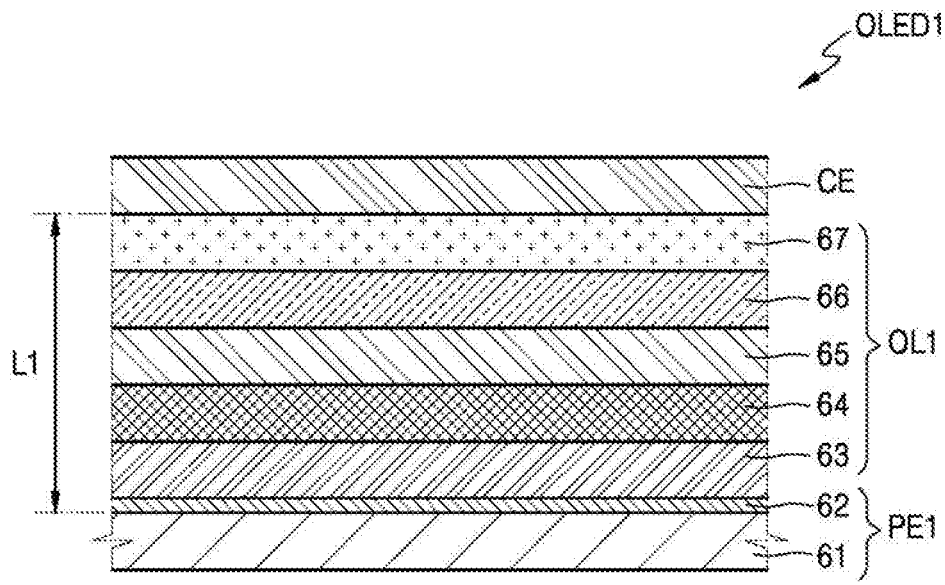
FIG. 6 is a schematic sectional view illustrating a first organic light-emitting diode device shown in FIG. 5.

FIG. 6 is a schematic sectional view of the first organic light-emitting diode device OLED1 shown in FIG. 5.

The first organic light-emitting diode device OLED1 shown in FIG. 6 includes the first pixel electrode PE1, the first organic layer OL1, and the counter electrode CE.

The first pixel electrode PE1 includes a reflective electrode that is electrically connected to the first thin-film transistor TFT1 and reflects light emitted by the first organic layer OL1, and for example, light emitted by a first light-emitting layer 65. The first pixel electrode PE1 may include a reflective electrode 61 formed of Ag, Mg, Al, Pt, Pd, Au, Ni, Nd, Ir, Cr, or a compound thereof and a transparent or semi-transparent electrode layer 62 formed on the reflective electrode 61.

The transparent or semi-transparent electrode layer 62 may include at least one selected from a group consisting of an indium tin oxide (ITO), an indium zinc oxide (IZO), a zinc oxide (ZnO), an indium oxide ($In_2O_3$), an indium gallium oxide (IGO), and an aluminum zinc oxide (AZO).

The counter electrode CE arranged to face the first pixel electrode PE1 reflects at least some light emitted by the first organic layer OL1, and for example, light emitted by the first light-emitting layer 65, thus forming a resonating structure together with the first pixel electrode PE1. The counter electrode CE includes a semi-transparent layer and may further include a transparent layer on the semi-transparent layer.

The transparent layer may include at least one selected from a group consisting of an indium tin oxide (ITO), an indium zinc oxide (IZO), a zinc oxide (ZnO), an indium oxide ($In_2O_3$), an indium gallium oxide (IGO), and an aluminum zinc oxide (AZO).

The semi-transparent layer may include at least one semi-transparent metal layer selected from a group consisting of Ag, Al, Mg, Li, Ca, Cu, LiF/Ca, LiF/Al, MgAg, and CaAg. The semi-transparent layer included in the counter electrode CE may be formed to have a surface facing the first organic layer OL1, where an area of the surface of the semi-transparent layer is identical to that of the entire first organic layer OL1.

Light emitted by the first light-emitting layer 65 travels back and forth between the counter electrode CE including the semi-transparent layer and the first pixel electrode PE1 including the reflective electrode 61, thereby causing resonance. By adjusting a distance (an optical path length) L1 between the first pixel electrode PE1 and the semi-transparent layer included in the counter electrode CE to satisfy conditions for constructive interference of light emitted by the first organic light-emitting diode device OLED1, intensity of light emitted by the first light-emitting layer 65 may be amplified while the light travels back and forth between the first pixel electrode PE1 and the counter electrode CE.

Amplified light exits the display device via the counter electrode CE, where light extracting efficiency may be increased by using a structure such as a microcavity.

The first organic layer OL1 includes the first light-emitting layer 65. The first light-emitting layer 65 may include a monomer organic material or a polymer organic material and may emit light having a wavelength corresponding to blue (B) color. The first organic light-emitting diode device OLED1 is a light-emitting diode device of the first sub-pixel SP1 shown in FIG. 4, where a center wavelength of light of a first color emitted by the first organic light-emitting diode device OLED1 is in a range from 390 nm to 450 nm. A center wavelength of light of a first color emitted by the first organic light-emitting diode device OLED1 may be in a range from 405 nm to 435 nm. A center wavelength of light of a first color emitted by the first organic light-emitting diode device OLED1 may be in a range from 410 nm to 430 nm. A center wavelength of light of a first color emitted by the first organic light-emitting diode device OLED1 may be in a range from 415 nm to 425 nm. A center wavelength of light of a first color emitted by the first organic light-emitting diode device OLED1 may be 420 nm.

Other than the first light-emitting layer 65, the first organic layer OL1 may further include at least one of various intermediate layers including a hole injection layer (HIL) 63 and a hole transport layer (HTL) 64 that are arranged between the first pixel electrode PE1 and the first light-emitting layer 65. An electron transport layer (ETL) 66 and an electron injection layer (EIL) 67 are arranged between the first light-emitting layer 65 and the counter electrode CE.

The distance L1 between the first pixel electrode PE1 and the counter electrode CE may be adjusted based on a wavelength of light emitted by the first light-emitting layer 65 by adjusting thickness(es) of the first light-emitting layer 65 and/or the intermediate layers 63, 64, 66, and 67 included in the first organic layer OL1, thereby satisfying conditions for constructive interference regarding a particular wavelength.

The distance L1 may be adjusted by adjusting thicknesses of the HIL 63 and the HTL 64, thereby satisfying conditions for constructive interference regarding a particular wavelength.

Since holes exhibit higher mobility than electrons, effects of adjusting the thicknesses of an HIL and an HTL to electric characteristics of an organic layer are less significant than effects of adjusting the thicknesses of an EIL and an ETL. Therefore, by adjusting the thicknesses of an HIL and an HTL, a resonance distance satisfying conditions for constructive interference regarding a particular wavelength may be secured without significantly affecting electric characteristics of an organic layer.

For the first organic light-emitting diode device OLED1 to emit light having a center wavelength of 420 nm, the distance L1 between the first pixel electrode PE1 and the counter electrode CE may be 161.6 nm. For the first organic light-emitting diode device OLED1 to emit light having a center wavelength from 415 nm to 425 nm, the distance L1 between the first pixel electrode PE1 and the counter electrode CE may be from 158.6 nm to 167.6 nm. For the first organic light-emitting diode device OLED1 to emit light having a center wavelength from 405 nm to 435 nm, the distance L1 between the first pixel electrode PE1 and the counter electrode CE may be from 145.6 nm to 176.6 nm.

To set the distance L1 between the first pixel electrode PE1 and the counter electrode CE to 161.1 nm, in the first pixel electrode PE1, the transparent or semi-transparent electrode layer 62 may be formed to have a thickness of 7 nm, the HIL 63 and the HTL 64 may be formed to have a total thickness of 98 nm, the first light-emitting layer 65 may be formed to have a thickness of 23.1 nm, and the ETL 66 and the EIL 67 may be formed to have a total thickness of 33.5 nm. The thickness of the counter electrode CE (for example, the thickness of the semi-transparent layer included in the counter electrode CE) may be 9.5 nm. Meanwhile, to set the distance L1 between the first pixel electrode PE1 and the counter electrode CE to a value other than 163 nm, the total thickness of the HIL 63 and the HTL 64 may be adjusted without changing the thicknesses of the other layers.

For example, to set the distance L1 between the first pixel electrode PE1 and the counter electrode CE to from 158.6 nm to 167.6 nm, in the first pixel electrode PE1, the transparent or semi-transparent electrode layer 62 may be formed to have a thickness of 7 nm, the HIL 63 and the HTL 64 may be formed to have a total thickness from 95 nm to 104 nm, the first light-emitting layer 65 may be formed to have a thickness of 23.1 nm, and the ETL 66 and the EIL 67 may be formed to have a total thickness of 33.5 nm. Thickness of the counter electrode CE (for example, thickness of the semi-transparent layer included in the counter electrode CE) may be 9.5 nm.

For example, to set the distance L1 between the first pixel electrode PE1 and the counter electrode CE to from 145.6 nm to 176.6 nm, in the first pixel electrode PE1, the transparent or semi-transparent electrode layer 62 may be formed to have a thickness of 7 nm, the HIL 63 and the HTL 64 may be formed to have a total thickness from 82 nm to 113 nm, the first light-emitting layer 65 may be formed to have a thickness of 23.1 nm, and the ETL 66 and the EIL 67 may be formed to have a total thickness of 33.5 nm. Thickness of the counter electrode CE (for example, a thickness of the semi-transparent layer included in the counter electrode CE) may be 9.5 nm.

An organic light-emitting display apparatus according to an exemplary embodiment of the present disclosure may be a top-emission type in which light emitted by the first light-emitting layer 65 is emitted toward the counter electrode CE either directly or after being reflected by the first pixel electrode PE1 including the reflective electrode 61.

Meanwhile, the first organic light-emitting diode device OLED1 shown in FIG. 6 might not include a resonance structure. In this case, a top emission type in which light emitted by the first light-emitting layer 65 is emitted toward the counter electrode CE or a bottom emission type in which light emitted by the first light-emitting layer 65 passes through the first pixel electrode PE1 and is emitted via the rear surface of the organic light-emitting display panel 100, may be employed. In the case of employing the top emission type, the counter electrode CE includes a transparent and/or semi-transparent layer. In the case of employing the bottom emission type, the first pixel electrode PE1 includes a transparent and/or semi-transparent layer.

If the first organic light-emitting diode device OLED1 does not include a resonance structure, the first light-emitting layer 65 is formed to contain a material for emitting light having a center wavelength from 390 nm to 450 nm. Here, the thickness of the first pixel electrode PE1 may be 100 nm, a sum of the thicknesses of the HIL 63 and the HTL 64 may be 100 nm, the thickness of the first light-emitting layer 65 may be 23.1 nm, a sum of the thicknesses of the ETL 66 and the EIL 67 may be 33.5 nm, and a sum of the thicknesses of the first pixel electrode PE1 and the first organic layer OL1 may be 256 nm±25 nm.

Meanwhile, although not shown in FIG. 6, a refraction layer for refracting emitted light may be further arranged on the counter electrode CE.

Figure 7:
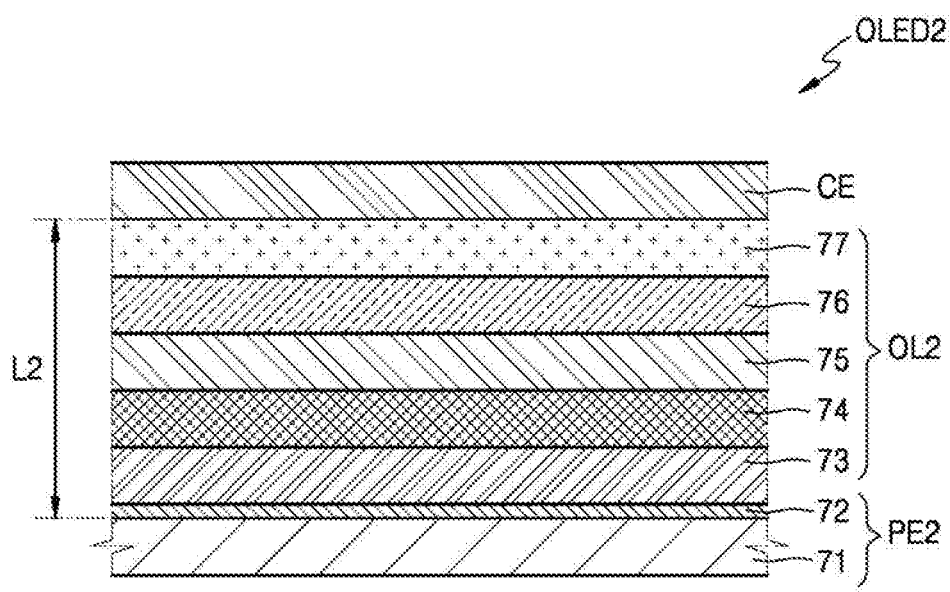
FIG. 7 is a schematic sectional view illustrating a second organic light-emitting diode device shown in FIG. 5.

FIG. 7 is a schematic sectional view of the second organic light-emitting diode device OLED2 shown in FIG. 5.

The second organic light-emitting diode device OLED2 shown in FIG. 7 consists of the second pixel electrode PE2, the second organic layer OL2, and the counter electrode CE.

The second pixel electrode PE2 includes a reflective electrode that is electrically connected to the second thin-film transistor TFT2 and reflects light emitted by the second organic layer OL2, and for example, light emitted by a second light-emitting layer 75. The second pixel electrode PE2 may include a reflective electrode 71 formed of Ag, Mg, Al, Pt, Pd, Au, Ni, Nd, Ir, Cr, or a compound thereof and a transparent or semi-transparent electrode layer 72 formed on the reflective electrode 71.

The transparent or semi-transparent electrode layer 72 may include at least one selected from a group consisting of an indium tin oxide (ITO), an indium zinc oxide (IZO), a zinc oxide (ZnO), an indium oxide ($In_2O_3$), an indium gallium oxide (IGO), and an aluminum zinc oxide (AZO).

The counter electrode CE is arranged to face the second pixel electrode PE2 and reflects at least some light emitted by the second organic layer OL2. For example, light emitted by the second light-emitting layer 75 may be reflected, thus forming a resonating structure together with the second pixel electrode PE2. The counter electrode CE includes a semi-transparent layer and may further include a transparent layer on the semi-transparent layer.

The transparent layer may include at least one selected from a group consisting of an indium tin oxide (ITO), an indium zinc oxide (IZO), a zinc oxide (ZnO), an indium oxide ($In_2O_3$), an indium gallium oxide (IGO), and an aluminum zinc oxide (AZO).

The semi-transparent layer may include at least one semi-transparent metal layer selected from a group consisting of Ag, Al, Mg, Li, Ca, Cu, LiF/Ca, LiF/Al, MgAg, and CaAg. The semi-transparent layer included in the counter electrode CE may be formed to have a surface facing the second organic layer OL2, where the area of the surface of the semi-transparent layer is identical to that of the whole second organic layer OL2.

Light emitted by the second light-emitting layer 75 travels back and forth between the counter electrode CE, including the semi-transparent layer, and the second pixel electrode PE2, including the reflective electrode 71, thereby causing resonance. By adjusting a distance (an optical path length) L2 between the second pixel electrode PE2 and the semi-transparent layer included in the counter electrode CE to satisfy conditions for constructively interfering light emitted by the second organic light-emitting diode device OLED2, intensity of light emitted by the second light-emitting layer 75 may be amplified while the light travels back and forth between the second pixel electrode PE2 and the counter electrode CE.

Amplified light exits via the counter electrode CE, where light extracting efficiency may be increased by using such a microcavity.

The second organic layer OL2 includes the second light-emitting layer 75. The second light-emitting layer 75 may include a monomer organic material or a polymer organic material and may emit light having a wavelength corresponding to yellow (Y) color. The second organic light-emitting diode device OLED2 is a light-emitting diode device of the first sub-pixel SP1 shown in FIG. 4, where a center wavelength of light of a second color emitted by the second organic light-emitting diode device OLED2 may be in a range from 520 nm to 590 nm. A center wavelength of light of a second color emitted by the second organic light-emitting diode device OLED2 may be in a range from 530 nm to 580 nm. A center wavelength of light of a second color emitted by the second organic light-emitting diode device OLED2 may be in a range from 540 nm to 570 nm. A center wavelength of light of a second color emitted by the second organic light-emitting diode device OLED2 may be in a range from 550 nm to 560 nm. A center wavelength of light of a second color emitted by the second organic light-emitting diode device OLED2 may be 555 nm.

Other than the second light-emitting layer 75, the second organic layer OL2 may further include at least one intermediate layer including a hole injection layer (HIL) 73 and a hole transport layer (HTL) 74 that are arranged between the second pixel electrode PE2 and the second light-emitting layer 75. An electron transport layer (ETL) 76 and an electron injection layer (EIL) 77 are arranged between the second light-emitting layer 75 and the counter electrode CE.

The distance L2 between the second pixel electrode PE2 and the counter electrode CE may be adjusted based on wavelength of light emitted by the second light-emitting layer 75 by adjusting thickness(es) of the second light-emitting layer 75 and/or the intermediate layers 73, 74, 76, and 77 included in the second organic layer OL2, thereby satisfying conditions for constructive interference regarding a particular wavelength.

The distance L2 may be adjusted by adjusting thicknesses of the HIL 73 and the HTL 74, thereby satisfying conditions for constructive interference regarding a particular wavelength.

Since holes exhibit higher mobility than electrons, effects of adjustment of the thicknesses of a HIL and a HTL to electric characteristics of an organic layer are less significant than effects of adjustment of the thicknesses of an EIL and an ETL. Therefore, by adjusting thicknesses of a HIL and a HTL, a resonance distance satisfying conditions for constructive interference regarding a particular wavelength may be secured without significantly affecting electric characteristics of an organic layer.

For the second organic light-emitting diode device OLED2 to emit light having a center wavelength of 555 nm, the distance L2 between the second pixel electrode PE2 and the counter electrode CE may be 262.5 nm. For the second organic light-emitting diode device OLED2 to emit light having a center wavelength from 520 nm to 590 nm, the distance L2 between the second pixel electrode PE2 and the counter electrode CE may be from 237.5 nm to 272.5 nm.

To set the distance L2 between the second pixel electrode PE2 and the counter electrode CE to 262 nm, in the second pixel electrode PE2, the transparent or semi-transparent electrode layer 72 may be formed to have a thickness of 7 nm, the HIL 73 and the HTL 74 may be formed to have a total thickness of 200 nm, the second light-emitting layer 75 may be formed to have a thickness of 22 nm, and the ETL 76 and the EIL 77 may be formed to have a total thickness of 33.5 nm. Thickness of the counter electrode CE (for example, thickness of the semi-transparent layer included in the counter electrode CE) may be 9.5 nm.

Meanwhile, to set the distance L2 between the second pixel electrode PE2 and the counter electrode CE to a value other than 262 nm, the total thickness of the HIL 73 and the HTL 74 may be adjusted without changing thicknesses of the other layers.

For example, to set the distance L2 between the second pixel electrode PE2 and the counter electrode CE to from 237.5 nm to 272.5 nm, in the second pixel electrode PE2, the transparent or semi-transparent electrode layer 72 may be formed to have a thickness of 7 nm, the HIL 73 and the HTL 74 may be formed to have a total thickness from 175 nm to 210 nm, the second light-emitting layer 75 may be formed to have a thickness of 23.1 nm, and the ETL 76 and the EIL 77 may be formed to have a total thickness of 33.5 nm. Thickness of the counter electrode CE (for example, a thickness of the semi-transparent layer included in the counter electrode CE) may be 9.5 nm.

An display apparatus according to an exemplary embodiment of the present invention may be a top-emission type in which light emitted by the second light-emitting layer 75 is emitted toward the counter electrode CE directly or after being reflected by the second pixel electrode PE2 including the reflective electrode 71.

Meanwhile, the second organic light-emitting diode device OLED2 shown in FIG. 7 might not include a resonance structure. In this case, a top emission type in which light emitted by the second light-emitting layer 75 is emitted toward the counter electrode CE or a bottom emission type in which light emitted by the second light-emitting layer 75 passes through the second pixel electrode PE2 and is emitted via the rear surface of the display panel 100, may be employed. In the case of employing the top emission type, the counter electrode CE includes a transparent and/or semi-transparent layer. In the case of employing the bottom emission type, the second pixel electrode PE2 includes a transparent and/or semi-transparent layer.

If the second organic light-emitting diode device OLED2 does not include a resonance structure, the second light-emitting layer 75 is formed to contain a material for emitting light having a center wavelength from 520 nm to 590 nm. Here, the thickness of the second pixel electrode PE2 may be 100 nm, a sum of the thicknesses of the HIL 73 and the HTL 74 may be 200 nm, the thickness of the second light-emitting layer 75 may be 42 nm, a sum of the thicknesses of the ETL 76 and the EIL 77 may be 33.5 nm, and a sum of the thicknesses of the second pixel electrode PE2 and the second organic layer OL2 may be 375 nm±37 nm.

Meanwhile, although not shown in FIG. 7, a refraction layer for refracting emitted light may be further arranged on the counter electrode CE.

Figure 8:
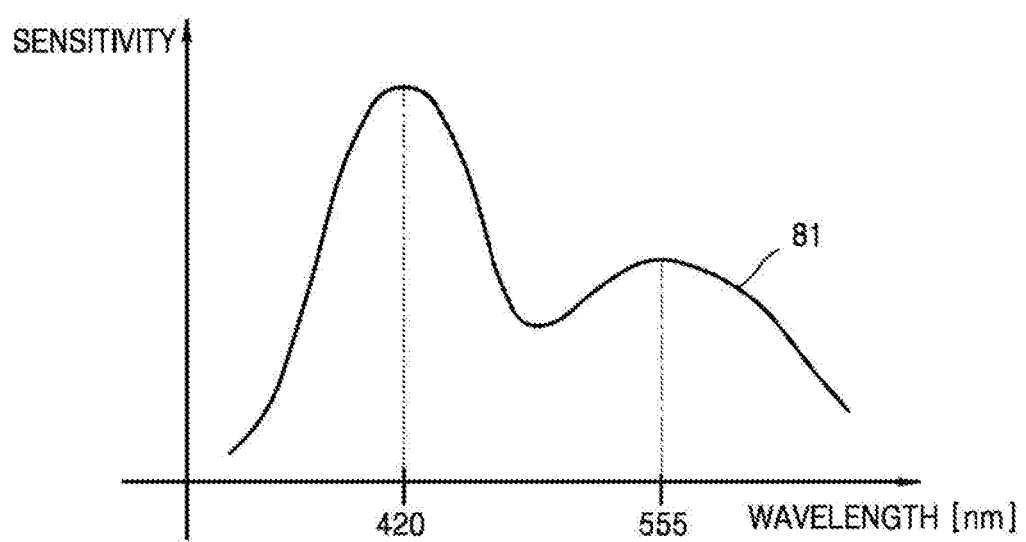
FIG. 8 is a diagram showing a curve indicating visual capabilities of a pet.

FIG. 8 is a diagram showing a curve indicating visual capabilities of a pet.

In detail, FIG. 8 is a diagram showing a curve indicating visual capabilities of a dog. A graph 81 shown in FIG. 8 indicates visual sensitivity of a dog according to wavelengths of light.

Referring to FIG. 8, visual cells of a dog exhibit high sensitivity at 420 nm and 555 nm. Based on the curve, it may be inferred that a dog has cone cells of two types including cone cells that are most sensitive to light of the wavelength of 420 nm and cone cells that are most sensitive to light of the wavelength of 555 nm. Therefore, when a pixel of a display apparatus for a dog are configured, the pixel may include a first sub-pixel that emits blue light of the wavelength of 420 nm and a second sub-pixel that emits yellow light of the wavelength of 555 nm, and thus light optimized to the visual capabilities of a dog may be emitted.

Figure 9:
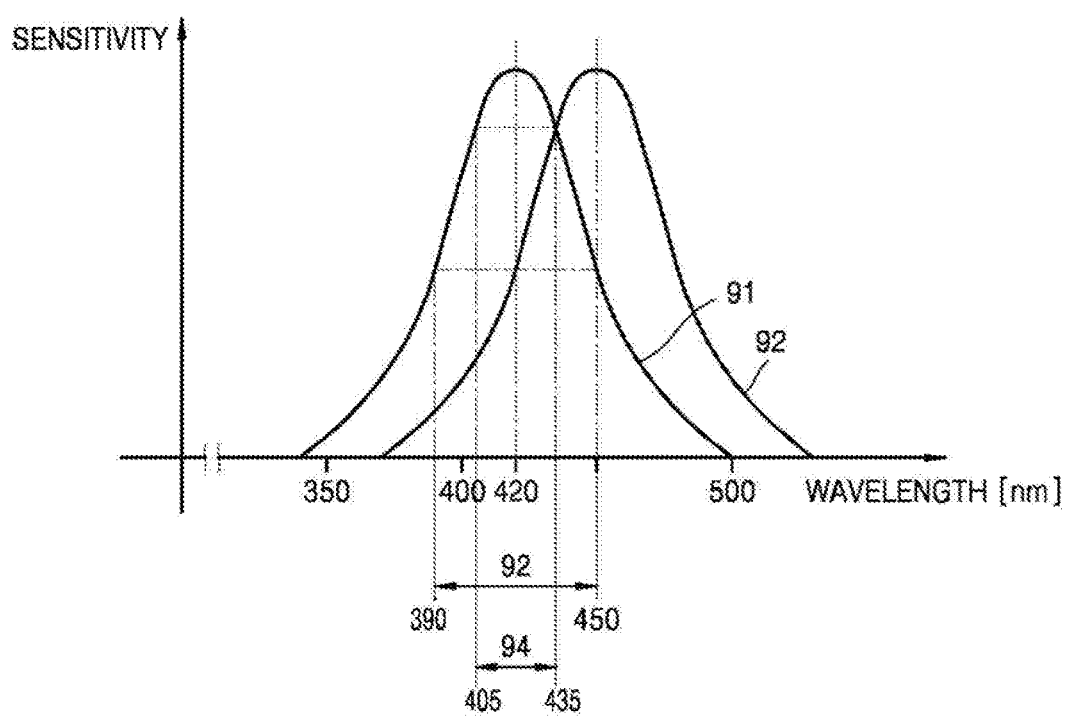
FIG. 9 is a diagram showing a curve regarding cone cells of a human for detecting blue light and cone cells of a pet for detecting blue light.

FIG. 9 is a diagram showing a response of human eye cone cells in detecting blue light and a response of human eye cone cells of a pet in detecting blue light.

Referring to FIG. 9, a graph 91 illustrates sensitivity of cone cells of a dog for detecting blue light according to wavelengths of light, whereas a graph 92 illustrates sensitivity of cone cells of a human for detecting blue light according to wavelengths of light.

Referring to the graph 92, cone cells of a human for detecting blue light are most sensitive to light having wavelength of 450 nm. Referring to graph 91, cone cells of a dog for detecting blue light are most sensitive to light having wavelength of 420 nm. Accordingly, cone cells of a dog are more sensitive to light of shorter wavelengths than cone cells of a human.

Therefore, by forming the first sub-pixel SP1 included in the display apparatus 10 to emit light having a wavelength from 390 nm to 450 nm, the display apparatus 10 may provide visual information to a dog at higher efficiency than a display apparatus that is designed to emit light having wavelength of 450 nm in the related art.

Referring to FIG. 9, when light having wavelength of 435 nm is emitted, cone cells of a human and cone cells of a dog exhibit a same sensitivity. Therefore, by forming the first sub-pixel SP1 included in the display apparatus 10 to emit light having a wavelength from 405 nm to 435 nm, an efficiency by which a dog recognizes an image displayed on the display apparatus 10 may become higher than an efficiency by which a human recognizes the image.

For example, by forming the first sub-pixel SP1 included in the display apparatus 10 to emit light having a wavelength within a narrow range from 415 nm to 425 nm, an efficiency by which a dog recognizes an image displayed on the display apparatus 10 may be increased.

For example, by forming the first sub-pixel SP1 included in the display apparatus 10 to emit light having a wavelength within a very narrow range around 420 nm, an efficiency by which a dog recognizes an image displayed on the display apparatus 10 may be maximized.

Figure 10:
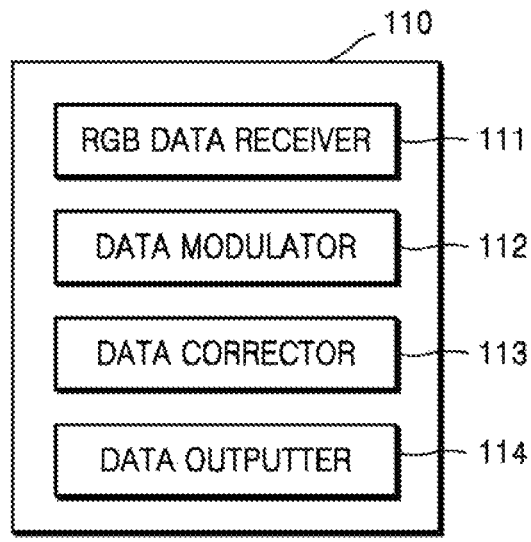
FIG. 10 is a schematic block diagram showing a configuration of a display controller according to an exemplary embodiment of the present invention.

FIG. 10 is a schematic block diagram showing a configuration of a display controller 110 according to an exemplary embodiment of the present invention.

The display apparatus 10 shown in FIG. 1 includes the display panel 100 as shown in FIGS. 2 and 3 and the display controller 110 that provides image data to be displayed on the display panel 100. Other than the display controller 110, the display apparatus 10 may further include components constituting a signal controller that receive image data from the display controller 110 and generate and applies electric signals (e.g. driving signals, scan signals, etc.) directly to the display panel 100.

The display controller 110, shown in FIG. 10, may correspond to at least one processor or may include at least one processor. Therefore, the display controller 110 may be included and driven in another hardware apparatus, such as a microprocessor or a general-purpose computer system.

FIG. 10 shows that the display controller 110 includes only certain components that are related to the present approach to clearly emphasize the technical features of the exemplary embodiments of the present invention.

Referring to FIG. 10, the display controller 110 according to an exemplary embodiment of the present invention includes an RGB data receiver 111, a data modulator 112, a data corrector 113, and a data outputter 114.

The display controller 110, according to an exemplary embodiment of the present invention, receives RGB data, modulates the RGB data to YB data that may be applied to blue (B) pixels and yellow (Y) pixels of a display apparatus, performs gamma correction on the YB data, and outputs final image data to the signal controller.

The RGB data receiver 111 receives image data in the RGB format from an external source or from an internal memory. Image data in the RGB format may be data including pixel data regarding red (R) sub-pixels, green (G) sub-pixels, and blue (B) sub-pixels of each of a set of frames. The RGB data receiver 111, according to an exemplary embodiment of the present invention, may receive image data encoded, decode the image data, and obtain image data in the RGB format according to certain rules.

The data modulator 112, according to an exemplary embodiment of the present invention, modulates the RGB data received by the RGB data receiver 111 to YB data. YB data may be data including pixel data regarding yellow (Y) sub-pixels and blue (B) sub-pixels of each of the frames. The data modulator 112 may modulate RGB data to YB data, such that colors embodied by pixel data of yellow (Y) and blue (B) sub-pixels included in the YB data is identical to colors embodied by pixel data of red (R), green (G), and blue (B) sub-pixels included in the RGB data.

The data corrector 113, according to an exemplary embodiment of the present invention, perform various corrections to the YB data generated by the data modulator 112. The corrections may include gamma correction. The gamma correction refers to a correction for non-linearly correcting respective values of pixel data according to a gamma curve (transfer function). Because the vision of a pet reacts in non-linear fashion, gamma correction is performed to reflect non-linear reaction, where the data corrector 113, according to an exemplary embodiment of the present invention, performs the gamma correction by taking into account non-linear visual reaction of a pet. The transfer function of a gamma curve may be defined by Equation 1 below, where characteristics thereof are defined based on gamma γ value.

$$V_C \sim V_S^{(1/\gamma)} \quad \text{[Equation 1]}$$

Here, $V_C$ denotes corrected data, whereas $V_S$ denotes input data.

The data outputter 114 outputs final YB data corrected by the data corrector 113 to the signal controller. The signal controller generates various signals to be applied to respective pixels of the display apparatus 10 based on the final YB data and applies the generated signals to the display apparatus 10.

Figure 11:
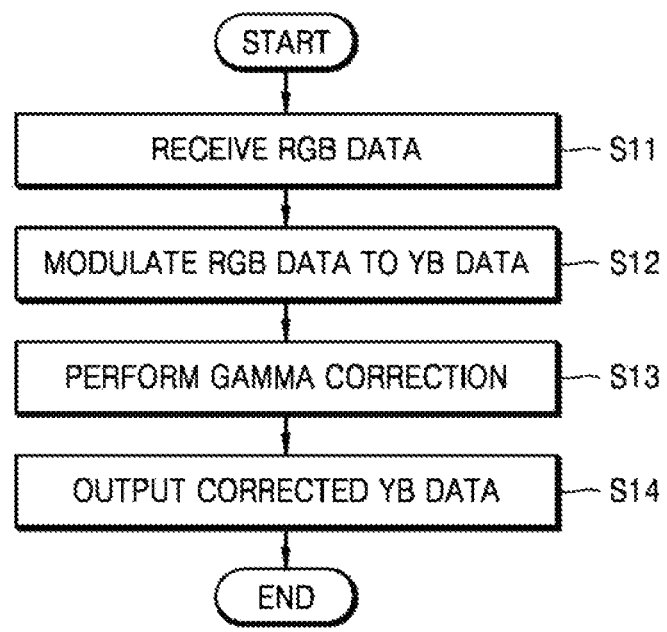
FIG. 11 is a flowchart showing a method of controlling a display apparatus, according to an exemplary embodiment of the present invention.

FIG. 11 is a flowchart showing a method of controlling an display apparatus according to an exemplary embodiment of the present invention.

The flowchart shown in FIG. 11 includes operations that are chronologically performed by the display controller 110 shown in FIG. 10. Therefore, even if omitted below, any of the descriptions given above in relation to the components shown in FIG. 10 may be applied to the flowchart of FIG. 11.

Referring to FIG. 11, in operation S11, the RGB data receiver 111 of FIG. 10 receives RGB data from an external source via a wired network or a wireless network or reads out and receives RGB data from an internal memory. In operation S12, the data modulator 112 of FIG. 10 modulates the RGB data received in the operation S11 to YB data. In operation S13, the data corrector 113 of FIG. 10 performs gamma correction on the YB data generated in the operation S12. In operation S14, the data outputter 114 of FIG. 10 outputs the YB data corrected in the operation S13 to the signal controller.

Figure 12:
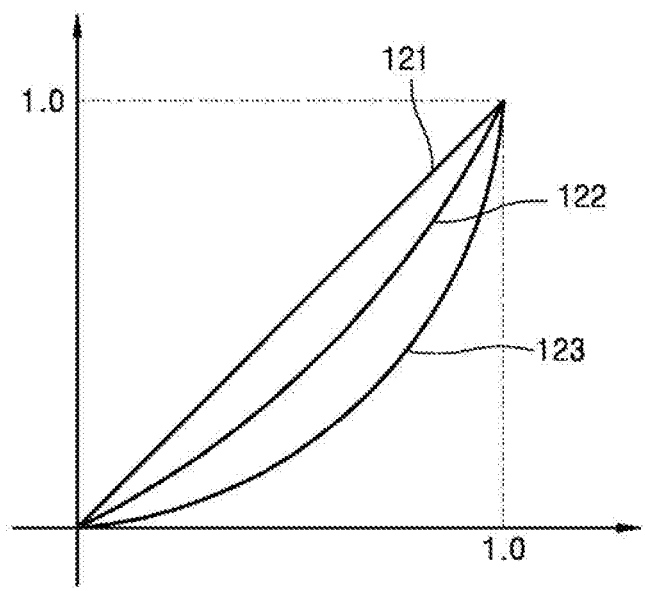
FIG. 12 is a diagram showing an example of gamma curves used by the data corrector 113 for gamma correction in accordance with exemplary embodiments of the present invention.

FIG. 12 is a diagram showing an example of gamma curves used by the data corrector 113 for gamma correction.

The horizontal axis of the gamma curve indicates intensity of input pixel data; the vertical axis of the gamma curve is intensity of output pixel data. FIG. 12 shows total 3 examples of gamma curves. First, graph 121 is an example of transfer functions in case where input data is identical to output data. For example, if gamma correction is performed according to the graph 121, data is not changed.

Graph 122 is an example of gamma curves by taking into account non-linear visual reaction of a human. If gamma correction is performed according to the graph 122, the gamma correction is performed in correspondence to the non-linear visual reaction of a human.

Graph 123 is an example of gamma curves taking into account non-linear visual reaction of a dog. If gamma correction is performed according to the graph 123, the gamma correction is performed in correspondence to the non-linear visual reaction of a dog.

A gamma curve may be defined as a gamma value, where γ1 (a gamma value of the graph 121) is 1, γ2 (a gamma value of the graph 122) is a value greater than γ1, and γ3 (a gamma value of the graph 123) is a value greater than γ2. For example, γ2 may be 2.2, whereas γ3 may be 4.0.

Figure 13:
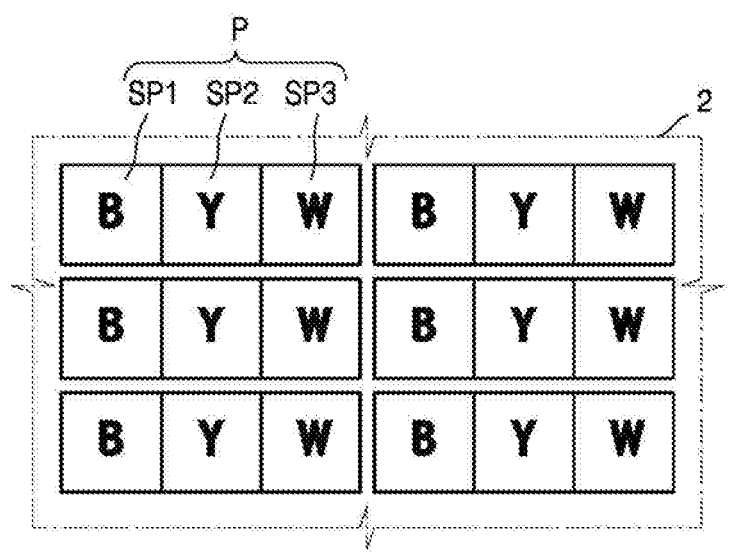
FIG. 13 is a plan view showing a portion of an organic light-emitting unit according to an exemplary embodiment of the present invention.

FIG. 13 is a plan view showing a portion of a light-emitting unit 2 according to an exemplary embodiment of the present invention.

Referring to FIG. 13, the light-emitting unit 2 includes a first sub-pixel SP1 emitting light of a first color, a second sub-pixel SP2 emitting light of a second color, and a third sub-pixel SP3 emitting light of a third color. The first color, the second color, and the third color are different from one another. The first color and the second color may be two different colors that may combine to form white light, whereas the third color may be white. According to an exemplary embodiment of the present invention, the first color may be blue, and the second color may be yellow. Therefore, by further arranging the third sub-pixel SP3 for emitting white light other than the first sub-pixel SP1 and the second sub-pixel SP2 as basic pixels for embodying full colors, brightness may be increased.

Generally, images displayed by an display apparatus include more white-based colors than black-based colors. Therefore, by utilizing the third sub-pixel SP3, power consumption may be reduced as compared to a case in which images are displayed by using the first sub-pixel SP1 and the second sub-pixel SP2 only.

A light-emitting layer of the third sub-pixel SP3 may include all of the materials constituting the light-emitting layers of the first sub-pixel SP1 and the second sub-pixel SP2. For example, the light-emitting layer of the third sub-pixel SP3 may have a double-layer structure including a first layer including materials constituting the light-emitting layer of the first sub-pixel SP1 and a second layer including materials constituting the light-emitting layer of the second sub-pixel SP2. However, the present disclosure is not limited thereto. Here, another layer may be interposed between the first layer and the second layer. The light-emitting layer of the third sub-pixel SP3 may have a triple-layer structure including first and second layers including materials constituting the light-emitting layer of the first sub-pixel SP1 and a third layer including materials constituting the light-emitting layer of the second sub-pixel SP2. Because the vision of a pet is more sensitive to blue light having a relatively short wavelength emitted by the first sub-pixel SP1 than to yellow light emitted by the second sub-pixel SP2, a layer including materials constituting the light-emitting layer of the first sub-pixel SP1 may include a plurality of layers, and thus white light further optimized to visual capabilities of a pet may be generated.

The illustrated order and the direction that the first sub-pixel SP1, the second sub-pixel SP2, and the third sub-pixel SP3 are arranged in a single pixel P, as shown in FIG. 13, is provided as an example, and the present disclosure is not limited thereto.

Figure 14:
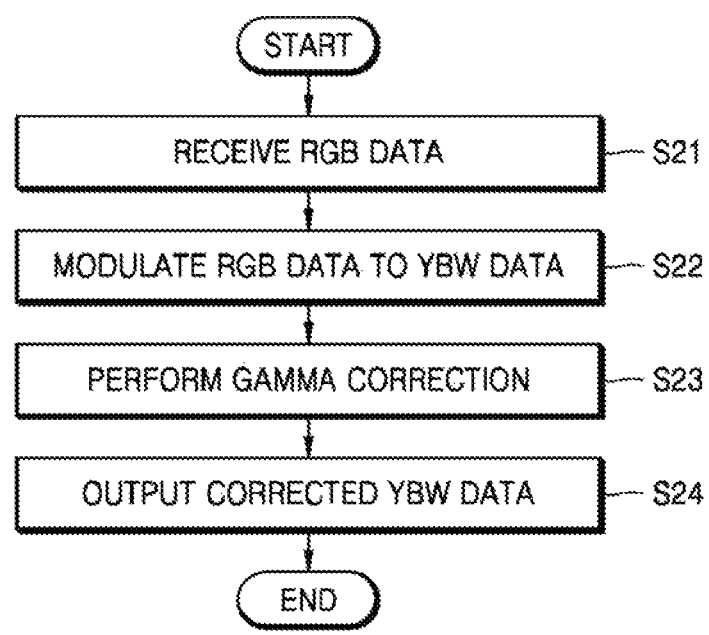
FIG. 14 is a flowchart showing a method of controlling a display apparatus, according to an exemplary embodiment of the present invention.

FIG. 14 is a flowchart showing a method of controlling a display apparatus according to an exemplary embodiment of the present invention.

The flowchart shown in FIG. 14 includes operations that are chronologically performed by the display controller 110 shown in FIG. 10. Therefore, even if omitted below, any of the descriptions given above in relation to the components shown in FIG. 10 may be applied to the flowchart of FIG. 14.

Referring to FIG. 14, in operation S21, the RGB data receiver 111 of FIG. 10 receives RGB data from an external source via a wired network or a wireless network or reads out and receives RGB data from an internal memory. In operation S22, the data modulator 112 of FIG. 10 modulates the RGB data received in the operation S21 to YBW data. In the operation S22, the data modulator 112 may modulate RGB data to YBW data, such that colors embodied by pixel data of yellow (Y), blue (B), and white (W) sub-pixels included in the YBW data is identical to colors embodied by pixel data of red (R), green (G), and blue (B) sub-pixels included in the RGB data.

In operation S23, the data corrector 113 of FIG. 10 performs gamma correction on the YBW data generated in the operation S22. In operation S24, the data outputter 114 of FIG. 10 outputs the YBW data corrected in the operation S23 to the signal controller.

The methods shown in FIGS. 11 and 14 may be instantiated as computer programs and can be implemented in general-use digital computers that execute the programs using a computer readable recording medium. Examples of the computer readable recording medium include magnetic storage media (e.g., ROM, floppy disks, hard disks, etc.), optical recording media (e.g., CD-ROMs, or DVDs), etc.

As described above, according to exemplary embodiments of the present invention, organic light-emitting display apparatuses, methods of controlling the same, and computer programs for implementing the methods of the present disclosure may display images optimized to visual capabilities of a pet. Exemplary embodiments of the present invention may be applied to a display apparatus using inorganic light-emitting device or liquid crystal display apparatus, etc.

Exemplary embodiments of the present invention described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the invention.

What is claimed is:

1. A display apparatus comprising: a plurality of pixels, wherein each of the plurality of pixels comprises a first sub-pixel and a second sub-pixel, wherein the first sub-pixel includes a first organic light-emitting diode that has an optical path length within a range from 147 nm to 179 nm and emits light having a center wavelength in a range of from 390 nm to 450 nm, and wherein the second sub-pixel includes a second organic light-emitting diode that has an optical path length within a range from 236 nm to 288 nm and emits light having a center wavelength in a range from 520 nm to 590 nm.

2. A method of controlling display of a display apparatus, using a processor, the method comprising:
receiving RGB data including sub-pixel data regarding red, green, and blue sub-pixels;
modulating the RGB data to YB data including data regarding a first sub-pixel that emits light having a center wavelength in a range from 390 nm to 450 nm and data regarding a second sub-pixel that emits light having a center wavelength that is different front the center wavelength of the light of the first sub-pixel;
performing gamma correction on the YB data; and
outputting the gamma-corrected YB data.

3. A non-transitory computer readable recording medium having recorded thereon a computer program for implementing the method of claim 2.

4. A display apparatus comprising:
a plurality of pixels, wherein each of the plurality of pixels comprises:
a first sub-pixel that emits light having a center wavelength in a range of from 390 nm to 450 nm; and
a second sub-pixel that emits light having a center wavelength that is different from that of the first sub-pixel.

5. The display apparatus of claim 4, wherein the first sub-pixel further comprises:
a pixel electrode, which is arranged on a substrate including a thin-film transistor, is electrically connected to the thin-film transistor, and reflects at least some incident light;
an organic layer, which is arranged on the pixel electrode and comprises a light-emitting layer; and
a counter electrode, which is arranged on the organic layer and constitutes a resonance structure together with the pixel electrode by reflecting at least some light emitted by the light-emitting layer.

6. The display apparatus of claim 5, wherein: light emitted by the light-emitting layer exits the display apparatus via the counter electrode, the pixel electrode comprises a reflective electrode, and the counter electrode comprises a semi-transparent layer that forms resonance together with the reflective electrode.

7. The display apparatus of claim 6, wherein the semi-transparent layer comprises a semi-transparent metal layer that comprises Ag, Al, Mg, Li, Ca, Cu, LiF/Ca, LiF/Al, MgAg, CaAg.

8. The display apparatus of claim 6, wherein the pixel electrode further comprises a transparent layer formed on the reflective electrode, and the transparent layer comprises indium tin oxide (ITO), indium zinc oxide (IZO), zinc oxide (ZnO), indium oxide ($In_2O_3$), indium gallium oxide (IGO), or aluminum zinc oxide (AZO).

9. The display apparatus of claim 6, wherein, when a distance between the reflective electrode and the semi-transparent layer is referred to as an optical path length, the first sub-pixel is formed to have an optical path length corresponding to a center wavelength of 420 nm.

10. The display apparatus of claim 9, wherein the optical path length of the first sub-pixel is within a range from 147 nm to 179 nm.

11. The display apparatus of claim 4, wherein a center wavelength of the light emitted from the second sub-pixel is in a range from 520 nm to 590 nm.

12. The display apparatus of claim 11, wherein the second sub-pixel further comprises:
a pixel electrode, which is arranged on a substrate including a thin-film transistor, is electrically connected to the thin-film transistor, and reflects at least some incident light;
an organic layer, which is arranged on the pixel electrode and comprises a light-emitting layer; and
a counter electrode, which is arranged on the organic layer and constitutes a resonance structure together with the pixel electrode by reflecting at least some light emitted by the light-emitting layer.

13. The display apparatus of claim 12, wherein light emitted by the light-emitting layer exits the display apparatus via the counter electrode, the pixel electrode comprises a reflective electrode, and the counter electrode comprises a semi-transparent layer that forms resonance together with the reflective electrode.

14. The display apparatus of claim 13, wherein, when a distance between the reflective electrode and the semi-transparent layer is referred to as an optical path length, the second sub-pixel is formed to have an optical path length corresponding to a center wavelength of 555 nm.

15. The display apparatus of claim 14, wherein the optical path length of the second sub-pixel is within a range from 236 nm to 288 nm.

16. The display apparatus of claim 14, wherein the optical path length is established by selecting a thickness of a hole injection layer (HIL) and a thickness of a hole transport layer (HTL).

17. The display apparatus of claim 4, wherein a size of the first sub-pixel is larger than that a size of the second sub-pixel.

18. The display apparatus of claim 4, wherein each of the plurality of pixels further comprises a third sub-pixel that emits white light.

19. The display apparatus of claim 4, wherein a center wavelength of the light of the first sub-pixel is in a range from 405 nm to 435 nm.

20. The display apparatus of claim 4, wherein a center wavelength of the light of the first sub-pixel is in a range from 415 nm to 425 nm.

21. The display apparatus of claim 4, further comprising a display controller, which provides image data to be displayed on the organic light-emitting diode display apparatus, wherein the display controller comprises:
an RGB data receiver, which receives RGB data including sub-pixel data regarding red, green, and blue sub-pixels; a data modulator, which modulates the RGB data to YB data including data regarding the first sub-pixel and data regarding the second sub-pixel;
a data corrector, which performs gamma correction on the YB data; and
a data outputter, which outputs the gamma-corrected YB data.

22. The display apparatus of claim 21, wherein the data modulator modulates the RGB data to YBW data including data regarding the first sub-pixel, data regarding the second sub-pixel, and data regarding a third sub-pixel that emits white light, the data corrector performs gamma correction on the YBW data, and the data outputter outputs the gamma-corrected YBW data.

23. The display apparatus of claim 21, wherein a gamma value for determining characteristics of a gamma curve used for the gamma correction is greater than 2.2.

24. The display apparatus of claim 4, comprises:
a substrate;
an organic light emitting unit, which is formed on the substrate and comprises the plurality of pixels; and
a sealing unit, which is formed on the substrate and seals the organic light emitting unit.

25. The display apparatus of claim 24, wherein the sealing unit comprises a thin-film encapsulating layer, and the substrate and the sealing unit are flexible.

26. The display apparatus of claim 4, wherein each of the plurality of pixels further comprises: a third sub-pixel that emits light having a center wavelength in a rage of from 265 nm to 390 nm.

27. The display apparatus of claim 4, wherein each of the plurality of pixels comprises no other sub-pixels but the first sub-pixel and the second sub-pixel.

28. The display apparatus of claim 4, wherein the first sub-pixel emits light having a center wavelength of 390 nm.

* * * * *